United States Patent [19]

Shepard

[11] Patent Number: 4,636,834
[45] Date of Patent: Jan. 13, 1987

[54] SUBMICRON FET STRUCTURE AND METHOD OF MAKING

[75] Inventor: Joseph F. Shepard, Hopewell Junction, N.Y.

[73] Assignee: International Business Machines Corporation, Armonk, N.Y.

[21] Appl. No.: 755,027

[22] Filed: Jul. 15, 1985

Related U.S. Application Data

[62] Division of Ser. No. 560,624, Dec. 12, 1983.
[51] Int. Cl.$^4$ .................. H01L 29/78; H01L 27/10
[52] U.S. Cl. .................................. 357/23.3; 357/49; 357/59; 357/41
[58] Field of Search .................... 357/23.3, 41, 59, 49

[56] References Cited

U.S. PATENT DOCUMENTS

| | | | |
|---|---|---|---|
| 3,460,007 | 8/1969 | Scott, Jr. .......................... | 317/235 |
| 3,484,313 | 12/1969 | Tanchi et al. ...................... | 148/187 |
| 3,600,651 | 8/1971 | Duncan ............................ | 148/188 |
| 3,664,896 | 5/1972 | Duncan ............................ | 148/187 |
| 3,978,515 | 8/1976 | Evans et al. ....................... | 357/44 |
| 4,209,349 | 6/1980 | Ho et al. .......................... | 148/187 |
| 4,209,350 | 6/1980 | Ho et al. .......................... | 148/188 |
| 4,234,362 | 11/1980 | Riseman .......................... | 148/187 |
| 4,236,294 | 12/1980 | Anantha et al. .................... | 29/578 |
| 4,256,514 | 3/1981 | Pogge ............................. | 148/1.5 |
| 4,309,812 | 1/1982 | Horng et al. ...................... | 29/578 |
| 4,359,816 | 11/1982 | Abbas et al. ...................... | 29/571 |
| 4,378,627 | 4/1983 | Jambotkar ......................... | 29/580 |
| 4,379,001 | 4/1983 | Sakai et al. ....................... | 148/187 |
| 4,400,865 | 8/1983 | Goth et al. ....................... | 29/590 |
| 4,419,809 | 12/1983 | Riseman .......................... | 29/571 |
| 4,419,810 | 12/1983 | Riseman .......................... | 357/23.3 |
| 4,424,621 | 1/1984 | Abbas et al. ...................... | 29/571 |
| 4,430,791 | 2/1984 | Dockerty .......................... | 29/571 |
| 4,445,267 | 5/1984 | Dida Moneda et al. ............... | 29/571 |
| 4,464,824 | 8/1984 | Dickman et al. .................... | 29/578 |
| 4,470,189 | 9/1984 | Roberts et al. ..................... | 29/571 |
| 4,507,171 | 3/1985 | Bhatia et al. ...................... | 357/59 |

OTHER PUBLICATIONS

Abbas et al., *IBM TDB* "Extending . . . Processing", Sep. 1977, vol. 20, No. 4, pp. 1376–1378.
Pogge et al., *IBM TDB* "Narrow . . . Method", Nov. 1976, vol. 19, No. 6, pp. 2057–2058.
Hunter et al., *IEEE EDL* vol. ED-2, No. 1, 1/81, pp. 4–6.
Jackson et al., *IEDM* 1979 Conference, pp. 58–61, "A Novel . . . Technique".
Ipri et al., *IEEE Transactions on Electron Devices* vol. ED-27, No. 7, 7/80, pp. 1275–1279.

*Primary Examiner*—Martin H. Edlow
*Assistant Examiner*—Jerome Jackson, Jr.
*Attorney, Agent, or Firm*—William T. Ellis

[57] ABSTRACT

A method for making contact to a small area field effect transistor device is described. A monocrystalline semiconductor body having at least a surface region of a first conductivity is provided with a insulating layer over the surface region. A substantially horizontal first conductive layer is formed over the insulating layer. The insulating and first conductive layers are masked and etched to form openings in the layers to the semiconductor body where the source, drain and gate region of the device is desired to be formed. The openings have substantially vertical surfaces on the layered structure. A conformal, highly doped of a second conductivity conductive layer is formed over the openings having these substantially vertical surfaces and over the insulating and conductive layers. The conformal conductive layer is anisotropically etched to substantially remove the horizontal portions of the conformal layer while leaving the openings with a substantially vertical conformal conductive layer on the sides thereof. The semiconductor body with the layered structure thereon is heated at a suitable temperature to cause the dopant of a second conductivity to diffuse into the semiconductor body from the conformal conductive layer to form the source and drain regions and a first insulating layer upon the surface of the first conductive layer and the conformal conductive layer. A second insulating layer is formed over the vertical conformal conductive layer. Then a gate dielectric is formed upon the surface of the semiconductor body between the source and drain regions. Electrical contacts are made to the first conductive layer through the first insulator layer which effectively makes electrical contact to the source and drain regions through the horizontal conductive layer and the vertical conformal conductive layer.

8 Claims, 6 Drawing Figures

ND METHOD OF MAKING

SUBMICRON FET STRUCTURE AND METHOD OF MAKING

TECHNICAL FIELD

Invention relates to methods for forming self-aligned field effect transistors and more particularly to forming such devices and making electrical thereto contact.

CROSS REFERENCE TO RELATED APPLICATION

U.S. Pat. No. 4,551,906 issued Nov. 12, 1985, entitled "Method for Making Self-Aligned Lateral Bipolar Transistors and Resulting Structure" by S. Ogura, et al., (FI 9-83-008).

BACKGROUND ART

Integrated circuits have substantially increased in complexitites over the years. The technology is moving towards smaller and smaller device structures. The extension of the technology to obtain narrow line widths in the range of one micrometer or less by extending conventional photolithography techniques such as electron beam, ultraviolet light, or X-ray lithography is becoming more difficult and expensive.

Other narrow device structure techniques have been developed to overcome this problem. One such technique is described in H. B. Pogge in IBM Technical Disclosure Bulletin, November 1976, Vol. 19, No. 6, pgs. 2057-2058 entitled "Narrow Line Widths Masking Methods". This method involves the use of a porous silicon followed by the oxidation of the porous silicon. Another technique is described by S. A. Abbas et al., in the IBM Technical Disclosure Bulletin, September 1977, Vol. 20, No. 4, pgs. 1376-1378. This method describes the use of polycrystalline silicon masking layers which are made to mask by first using intermediate mask of oxidation blocking material, such as silicon nitride in the formation of the polycrystalline silicon. Line dimensions below about 2 micrometers may be obtained by this technique.

Methods for forming narrow dimensioned, for example, sub-micrometer regions on the silicon body are disclosed by U.S. Pat. Nos. 4,209,349 and 4,209,350 by I. T. Hol et al., and U.S. Pat. No. 4,234,362 by J. Riseman. These patents involve the formation of substantially horizontal surfaces and substantially vertical surfaces on the silicon body and then forming a vertical layer of a very narrow dimension on the substantially vertical surfaces. This layer may be formed by initially depositing a very narrow dimensioned layer on both the substantially horizontal and substantially vertical surfaces followed by an anisotropic reactive ion etching process to remove the horizontal layer while leaving the vertical layer substantially intact. The vertical layer dimension is adjusted depending upon the original thickness of the layer applied. Alternatively, the vertical layer may be formed by the oxidation of a side edge of a polysilicon layer which has its top surface masked by a oxidation resistant coating such as silicon nitride as described in the S. G. Barbee et al., IBM Technical Disclosure Bulletin, Aug. 19, 1982, Vol. 25, No. 3B, pgs. 1448-1449 or as shown in the H. B. Pogge, U.S. Pat. No. 4,256,514. In these ways a narrow dimension region of one micrometer or less may be obtained.

A further major related problem in the very dense integrated circuit technology is how to electrically contact the various elements and devices of such narrow dimensions in the integrated circuit. It is known to use highly doped polycyrstalline silicon as a source of a dopant for regions of monocrystalline silicon to form PN junctions therein. The polycrystalline silicon can either be removed or allowed to become part of the device as the electrical contact for the region formed by the out-diffusion from the polycrystalline silicon. Such processes are taught, for example by D. M. Duncan, U.S. Pat. Nos. 3,978,515; J. H. Scott, Jr., 3,460,007; D. M. Duncan, 3,664,896; S. Tauchi et al., 3,484,313 and the aforementioned I. T. Ho et al., 4,209,350. However, these patents are either silent on the method for the next level metallurgy to the electrical contact or have a second level metallurgy directly aboe the polycrystalline silicon electrical contact to the PN junction.

Other workers in the field have addressed the electrical contact in other ways, such as U.S. Pat. No. 3,600,651 by providing lateral polycrystalline silicon contacts to a monocrystalline silicon active region. The polycrystalline silicon is then contacted at a more convenient location laterally away from the active region. N. G. Anantha et al., U.S. Pat. No. 4,236,294 also uses the technique of a polycrystalline silicon contact to a PN junction and then a contact to the polycrystalline layer at some convenient distance laterally away from the PN junction. The H. S. Bhatia et al., patent application Ser. No. 405,844 filed Aug. 6, 1982 now U.S. Pat. No. 4,507,171 entitled "Method For Contacting A Narrow Width PN Junction Region and Resulting Structure" described further methods for making contact to a narrow width PN junction region by electrically contacting a horizontal conductive layer at a convenient location. The horizontal conductive layer in turn contacts a vertical conductive layer which makes contact to the element of the integrated circuit.

There has been significant effort in the integrated circuit field to develop processes for making sub-micrometer channel length field effect transistor with a high degree of channel length control. Examples of this work are described in "A New Edge-defined Approach for Sub-micrometer MOSFET Fabrication" by W. R. Hunter et al., IEEE Electron Device Letters, Vol. EDL-2 No. 1, January 1981, pp. 4-6, "Sub-micrometer Polysilicon Gate CMOS/SOS Technology" by A. C. Ipri et al., published in IEEE Transactions on Electron Devices, Vol. ED-27, No. 7, July 1980, pp. 1275-1279 and "A Novel Sub-micron Fabrication Technique" by T. N. Jackson et al., published in IEDM 1979 Conference Volume, pp. 58-61. The first paper relies on the reactive ion etching technique to form a sidewall silicon dioxide. The second paper utilizes a technique involving lateral diffusion of boron. The third method uses the plating of a metal on the edge of a conventionally patterned metal layer. Other short channel field effect transistor devices are illustrated in the patent applications Ser. Nos. 335,893 filed 12/30/81 by J. Riseman et al., 335,891 filed 12/30/81 by R. C. Dockerty and 335,953 filed 12/30/81 by F. H. De La Moneda et al.

A particularly effective MOSFET configuration allowing densities and performance higher than that heretofore available in such devices is described in "A New Short Channel MOS FET with Lightly Doped Drain" by Saito et al., in Denshi Tsushin Rengo Taikai (Japanese) April 1978, p. 2-20. The LDD N channel MOSFET includes, in addition to the channel separating implanted N+ source and drain regions, sub-micrometer diffused N− regions, which increases the channel breakdown voltage or snapback voltage and reduces device drain junction electron impact ionization (and thus, hot electron emission) by spreading the high electric field at the drain pinchoff region into the N− region. This allows either an increase in power supply voltage or reduction in channel length at a given voltage to achieve performance enhancement. An improved process for making such a device is given in U.S. Pat. No. 4,366,613 by S. Ogura and P. J. Tsang in which the N− LDD region of the device is formed by a controlled N− ion implantation and the forming of sub-micrometer wide SiO2 sidewall spacers abutting to the gate. Other lightly doped drain processes are given in the before mentioned I. T. Ho and J. Riseman U.S. Pat. Nos. 4,209,349; 4,209,350 and patent application Ser. No. 335,892 filed 12/30/81 by J. Riseman. These patents also show self-aligned diffused regions formed by outdiffusion from layers formed on the surface of a semiconductor substrate into the substrate. In the above mentioned Ogura and Tsang's patent, the polycrystalline silicon gate plate of the LDDFET is formed by conventional lithographic process. Its minimum achievable length is limited by the capability of the lithographic tool used. Further, there is no highly dense way to electrically contact the elements of the field effect devices. In the present invention the minimum achievable device gate length is no longer limited by the lithographic tools but can be set by design requirement. Devices with channel length less than one micrometer can be readily made with conventional photolithographic tools.

It is therefore desirable to provide a high density, short channel field effect transistor which can be fabricated with submicron channel length and which can be effectively electrically contacted.

SUMMARY OF THE INVENTION

In accordance with the present invention an integrated circuit field effect transistor structure is described which has a sub-micrometer channel length. A semiconductor body having surface regions thereof isolated from other such surface regions by a patter of isolation is provided. Narrow width PN junctions source and drain regions ae located within at least one of the surface regions and spaced from one another. Each of the PN junctions has a width substantially that of the electrical contact. Substantially vertical conformal conductive layers are in electrical ohmic contact to each of the PN junction regions. A substantially horizontal conductive layer is in electrical contact with an edge of each of the vertical conductive, layers and separated from the surface region by a first insulating layer. A second insulating layer covers the conformal conductive layers. The horizontal conductive layer is patterned so as to have the conductive lines which contact the source and drain regions electrically separated from one another. A third electrical insulating layer is located over the patterned horizontal conductive layers. A gate dielectric layer is formed over the channel between the source and drain regions. A gate electrode is located upon the gate dielectric layer. The gate electrode is separated from the vertical conductive layers by the second insulating layer. An electrical ohmic contact is made to each of the portions of the patterned horizontal conductive layers through an opening in the third electrical insulating layer. Effectively, this contact makes electrical contact to the narrow width PN junction source and drain regions through the patterned horizontal conductive layer and the vertical conformal conductive layer.

A method for making contact to a small area field effect transistor device is described. A monocrystalline semiconductor body having at least a surface region of a first conductivity is provided with a insulating layer over the surface region. A substantially horizontal first conductive layer is formed over the insulating layer. The insulating and first conductive layers are masked and etched to form openings in the layers to the semiconductor body where the source, drain and gate region of the device is desired to be formed. The openings have substantially vertical surfaces on the layered structure. A conformal, highly doped of a second conductivity conductive layer is formed over the openings having these substantially vertical surfaces and over the insulating and conductive layers. The conformal conductive layer is anisotropically etched to substantially remove the horizontal portions of the conformal layer while leaving the openings with a substantially vertical conformal conductive layer on the sides thereof. The semiconductor body with the layered structure thereon is heated at a suitable temperature to cause the dopant of a second conductivity to diffuse into the semiconductor body from the conformal conductive layer to form the source and drain regions and a first insulating layer upon the surface of the first conductive layer and the conformal conductive layer. A second insulating layer is formed over the vertical conformal conductive layer. Then a gate dielectric is formed upon the surface of the semiconductor body between the source and drain regions. Electrical contacts are made to the first conductive layer through the first insulator layer which effecitvely makes electrical contact to the source and drain regions through the horizontal conductive layer and the vertical conformal conductive layer.

DISCLOSURE OF THE INVENTION

Referring now more particularly to FIGS. 1 through 4 there is illustrated an embodiment for fabricating a sub-micrometer channel length field effect transistor in a high density circuit structure. The process is illustrated to form N channel MOSFET integrated circuits. However, it would be obvious that P channel field effect transistors can alternatively be formed by the present embodiment by simply reversing the polarity of the various elements of the transistor and associated regions.

Figure 1:
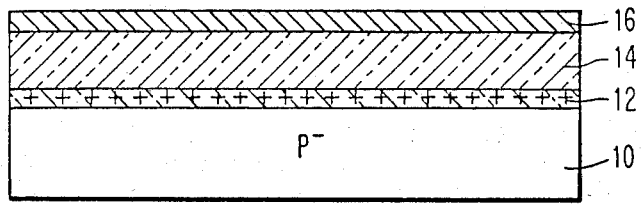
FIGS. 1 through 6 schematically illustrate the process for forming the self-aligned, sub-micrometer channel length field effect transistor structure of the present invention.

FIG. 1 illustrates the first series of steps wherein the semiconductor body is a P− <100> crystallographic oriented monocrystalline silicon body 10. A layer 12 of silicon dioxide is formed by a thermal oxidation process, such as, wet oxygen at a temperature of 970° C. Boron ions are then blanket implanted into the silicon dioxide layer 12 atom energy of between about 15 to 40 KeV and dosage of between about 1 to $3 \times 10^{16}$ atoms/cm$^3$. The thickness of the silicon dioxide film is between about 100 to 200 nanometers. A chemical vapor deposited silicon dioxide layer 14 is now deposited upon the silicon dioxide layer 12. The silicon dioxide layer 14 may be deposited by, for example, using SiH4Cl2 and N₂O at a temperature of about 800° C. or less under atmospheric or low pressure conditions; SiH₄+O₂ at about 400° C.; or plasma enhanced chemical vapor deposition using SiH₄+O₂. the SiO₂ thickness of layer 14 is typically between about 400 to 700 nanometers.

A substantially horizontal first conductive layer 16 is formed over the silicon dioxide layer 14. This conductive layer 16 may be composed of a highly doped polycrystalline silicon material; a refractory metal material, such as, tungsten or molybdenum; a refractory metal silicide, such as, WSi₂ or TaSi₂; or the so-called polycide film which consists of a layer of a metal silicide in combination with a layer or layers of polycrystalline silicon. The doped polycrystalline silicon thickness would be of the order of 200 to 400 nanometers. The thickness of a refractory metal layer would be of the order of 200 to 300 nanometers. The metal silicide layer thickness would be, for example, for the range of about 200 to 300 nanometers. The polycide thickness would range from about 200 to 400 nanometers polycrystalline silicon and 200 to 300 nanometers metal silicide. It is preferred that the horizontal conductive film be composed of a polycide because its sheet resistance is lower than polysilicon alone and it can be thermally oxidized if necessary, while refractory metals cannot be so readily oxidized.

Figure 2:
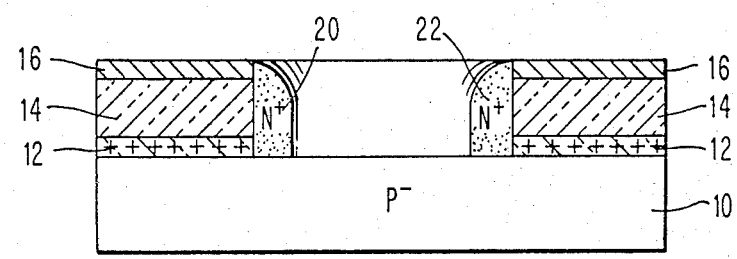
Figure 3:
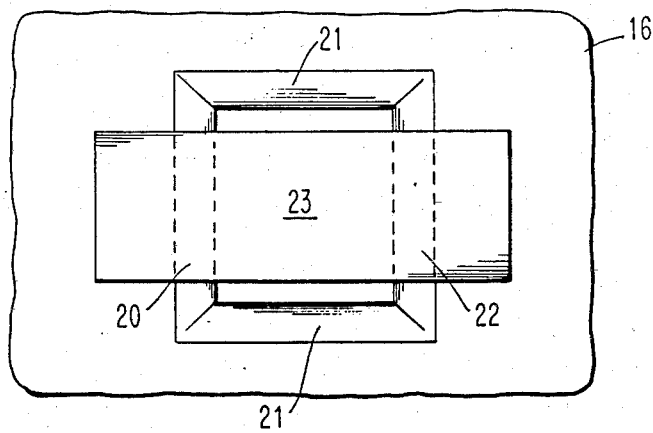

Standard lithography and reactive ion etching techniques are used to form openings in the multi-layered structure of FIG. 1 at the location of the desired field effect transistor structures. The source/drain regions of the field effect transistors are to be located just within the sides of the etched opening. The sides of the opening are required to be substantially vertical. To obtain the substantially vertical sidewalls of the etched out regions it is necessary to use anisotropic etching for each of the layers 12, 14 and 16. The ambient used in the etching process for silicon or silicide is CF₄/O₂, CCl₂F₂/O₂ or SF₆/Cl₂. The ambient used for etching metal is CF₄/H₂ or CHF₃/Ar. A layer of polycrystalline silicon of N+ type polycrystalline silicon is blanket deposited over the etched structure. The polycrystalline silicon can be doped in-situ or deposited substantially undoped and then subsequent ion implantation and heating process or by thermal diffusion. If doping is done subsequently the typical process uses POCl₃ at 870° C. followed by a drive-in at 925°–970° C. to achieve about 15 ohms/square on single crystal monitor. The polycrystalline silicon doping level is about 5 to 10×10¹⁹/cm³. An ion implantation process uses between about 1×10¹⁵ to 1×10¹⁶ ions/cm² at 30 to 100 KeV. The preferred conductivity imparting ion is arsenic. The conformal conductive layer of N+ polycrystalline silicon is now subjected to an anisotropic etch using for example CCL₂F₂+O₂ at 600 watts, and 20 millitorr of pressure. The result is to substantially remove the horizontal portions of the N conformal conductive layer and to substantially leave the substantially vertical conformal conductive layers 20 and 22 as seen in FIG. 2. The vertical conformal conductive layers 20 and 22 are at this point connected with unwanted sidewall regions 21 as seen in the structural top view FIG. 3. These portions 21 are readily removed by use of lithography and etching techniques. The FIG. 3 illustrates the presence of resist mask 23 protecting the layers 20 and 22 from a subsequent wet chemical or plasma etchant.

Following the removal of the unwanted sidewall portions 21, the resist layer 23 is removed. The structure is subjected to an thermal oxidation ambient of wet oxygen at a temperature of 800° C. to obtain a 3:1 to 4:1 oxidation differential between the monocrystalline silicon and the polycrystalline vertical conformal conductive layers 20 and 22. The result of this process is the formation of a silicon dioxide layer 24. About 50 nanometers to 100 nanometers silicon dioxide is grown upon single monocrystalline silicon area and about 300 to 400 nanometers silicon dioxide is grown upon the polycrystalline silicon layer. During this time some source-drain diffusion will take place from the polycrystalline silicon layer 20, but the final tailoring will be done with an inert anneal somewhere late in the process, if required, to form the source/drain regions 26 and 28, and the P doped field isolation regions 30.

Figure 4:
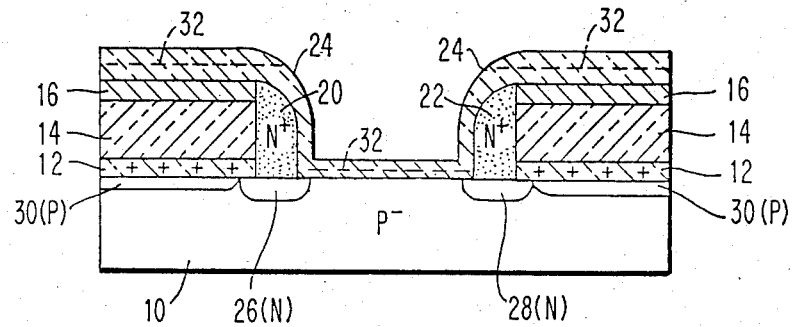

The FIG. 4 structure is now placed in an ion implantation apparatus wherein a N type ion implantation, such as, with the use of arsenic ions in accomplished at about 50 to 120 KeV while using a dosage of between about $5\times10^{13}$ to $5\times10^{14}$ ions/cm². The result of the ion implantation process is shown in FIG. 4 wherein the presence of negative ions are shown by the dashed line 32. The N ions have been imbedded in the horizontal portions only of the silicon dioxide layer 24 by the use of a directional ion implantation process. The concentration of these ions in the silicon dioxide layer 24 is of the order of $5\times10^{17}$ to $5\times10^{18}$ atoms/cc.

A conformal silicon dioxide chemical vapor deposition form a silicon dioxide layer 36 over the FIG. 4 structure. The deposition uses tetraethyl orthosilicate (TEOS) low pressure chemical vapor deposition (LPCVD) process at about 800° C. or LPCVD SiH₄+O₂ at 400° C. to produce a thickness of between about 200 to 400 nanometers silicon dioxide layer 36. An anisotropic reactive ion etchant process using an ambient of either CHF₃/Ar or CF₄/H₂ to remove the horizontal portions of the layer 36 while leaving the substantially vertical portions of the silicon dioxide sidewall 36 as shwon in FIG. 5. The opening has been chosen wide enough to hereafter form the desired channel width of the field effect transistor device. The exposed portion of the silicon dioxide layer 32 over the monocrystalline silicon body 10 is removed by reactive ion etching right down to the silicon body. The exposed portion of the silicon dioxide layer 32 upon the polycide layer 16 is also etched during this process but since it is thicker a sufficient silicon dioxide layer will remain upon the polycide layer 16 after the etching process.

The horizontal conductor layer 15 is patterned by lithography and reactive ion etching techniques to give the desired wiring pattern at this conductor level. The wiring pattern separates the electrical connections (not shown in the drawing) to source and drain elements of the illustrated device by this etching step.

A channel ion implantation is used for $V_T$ adjustment. The conditions are typically using a boron dosage of between about 2 to $6\times10^{11}$ atoms/cm² at 45 to 65 KeV.

A thin silicon dioxide gate dielectric layer 40 is grown upon the exposed monocrystalline silicon body 10 using wet oxygen at a temperature of 970° C. The preferred thickness of this gate dielectric silicon dioxide is between about 10 to 50 nanometers. During this oxidation process the lightly doped N− regions 46 and 48 are formed by out-diffusion from the silicon dioxide layer 24 having the negative ions 32 therein. It should, of course, be understood that the N− outdiffusion begins during the oxide growth step and will continue with subsequent heat treatments.

Figure 5:
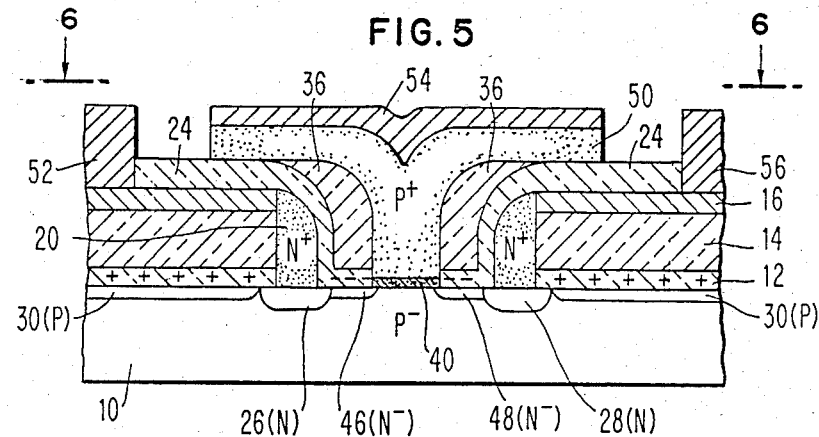
Figure 6:
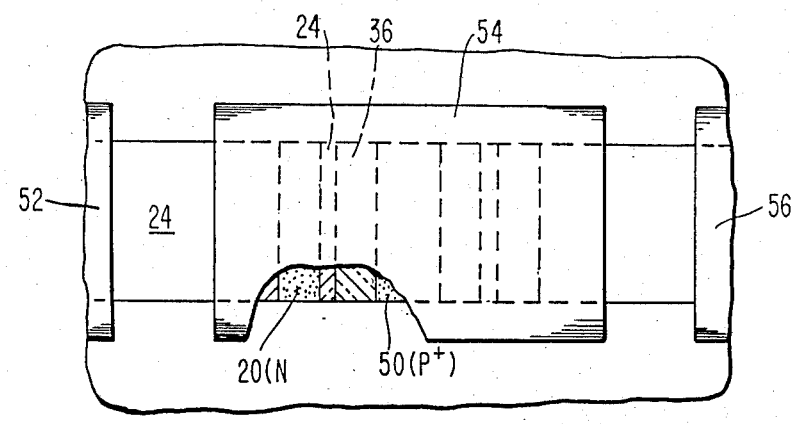

A P+ or N+ polycrystalline silicon layer 50 is now uniformly deposited over the surface and fills the remaining portion of the originally etched opening as shown in FIG. 5. This polycrystalline silicon layer 50 is to be connected as the gate electrode for the field effect transistor device. Lithography and etching techniques are utilized to delineate the polycrystalline layer 50 to be located only in the desired gate electrode region. Lithography and etching techniques are utilized to form contact openings through the silicon dioxide layer 24 to the horizontal conductive layer 16. A blanket deposition of a suitable metal of, for example, a transition metal, aluminum, aluminum-copper, or the like, over the surface of the structure is made. Other metal contacts may be made by deposition of palladium, or the like, in a reaction with silicon to form metal silicide contacts. Lithography and etching are utilized to delineate in this metal layer for the desired contact structure of the source electrode 52, gate electrode 54, and drain electrode 56. It should be noted that the horizontal conductor 16 has been earlier patterned so that the source electrode 52 connects only through one portion of the horizontal conductive layer 16 and through the vertical conformal layer 20 to the source region 26. In a similar way the drain is connected from electrode 56 through the horizontal layer 16 and the vertical conformal layer 22 to the drain region 28. The FIG. 6 is a illustration of a top view of the FIG. 3 cross-sectional view as seen along lines 6:6.

While the invention has been particularly shown and described with reference to preferred embodiments thereof, it will be understood by those skilled in the art that the foregoing and other changes in form and detail may be made without departing from the spirit and scope of the invention.

What is claimed is:

1. An integrated circuit field effect transistor structure comprising:
   a semiconductor body with a surface region;
   a first insulator layer disposed over said surface region;
   a substantially horizontal conductive layer disposed over said first insulator layer and having a plurality of different patterns formed therein;
   a trench opening in said conductive layer and said first insulator layer down to said semiconductor body and having substantially vertical sidewalls;
   a pair of vertical conformal conductive sidewall layers disposed conformally only on one set of opposite vertical sidewalls of said trench and not electrically connected and containing a dopant with a first conductivity type therein suitable for outdiffusion, said vertical conformal conductive sidewall layers being in electrical contact with different patterns in said substantially horizontal conductive layer;
   a source region formed in said semiconductor substrate substantially only directly below one of said vertical conformal conductive sidewall layers and having a dopant with said first conductivity type;
   a drain region formed in said semiconductor substrate substantially only directly below the other of said vertical conformal conductive sidewall layers and having a dopant with said first conductivity type;
   a second substantially vertical insulator layer disposed conformally on said vertical conformal conductive sidewall layers, and a second horizontal insulator layer disposed conformally in said trench opening, with said second horizontal insulator layer having therein a dopant of said first conductivity type suitable for outdiffusion;
   a pair of third substantially vertical conformal insulator sidewall layers disposed conformally only on said second substantially vertical insulator layer down to said second horizontal insulator layer;
   a channel opening down to said semiconductor body in said second horizontal insulator layer in said trench opening and between said pair of third substantially vertical conformal insulator sidewall layers;
   a doped region disposed in said semiconductor body substantially only below each of said third substantially vertical conformal insulator sidewall layers, with said doped regions having a dopant of first conductivity type but with a lower doping concentration than the doping in said source and drain regions;
   a gate dielectric disposed in said channel opening;
   a gate electrode disposed on said gate dielectric; and
   electrical ohmic contacts connected to said patterns in said substantially horizontal conductive layer.

2. The integrated circuit of claim 1 wherein said semiconductor body is composed of monocrystalline silicon.

3. The integrated circuit of claim 1 wherein said vertical conformal conductive sidewall layers are composed of highly doped polycrystalline silicon, said horizontal conductive layer is composed of a refractory metal and said semiconductor body is composed of monocrystalline silicon.

4. The integrated circuit of claim 1 wherein said vertical conformal conductive sidewall layers are composed of a highly doped polycrystalline silicon, said horizontal conductive layer is composed of a refractory metal silicide and said semiconductor body is composed of monocrystalline silicon.

5. The integrated circuit of claim 1 wherein said semiconductor body is composed of P type monocrystalline silicon and said source and drain regions are N type.

6. The integrated circuit of claim 1 wherein said insulating layers and insulating sidewalls are silicon dioxide.

7. The integrated circuit of claim 3 or 4 wherein said gate electrode comprises a polycrystalline layer an an aluminum layer, and said electrical contacts to said horizontal conductive layer is aluminum.

8. The integrated circuit of claim 3 or 4 wherein the minimum thickness of the said vertical conformal conductive sidewall layers is between about 100 to 500 nanometers.

* * * * *